United States Patent

[11] 3,615,943

[72] Inventor Milton Genser
10 Lancer Drive, Short Hills, N.J. 07078
[21] Appl. No. 879,691
[22] Filed Nov. 25, 1969
[45] Patented Oct. 26, 1971

[54] DEPOSITION OF DOPED AND UNDOPED SILICA FILMS ON SEMICONDUCTOR SURFACES
9 Claims, 8 Drawing Figs.

[52] U.S. Cl. .......... 148/188, 117/123 A, 117/201, 148/1.5, 148/186
[51] Int. Cl. .......... H01l 7/34, C03c 17/30
[50] Field of Search .......... 148/188, 186, 1.5; 117/201, 33.3, 124 B, 123 A, 123 B, 169; 23/182 R

[56] References Cited

UNITED STATES PATENTS

| | | | |
|---|---|---|---|
| 3,084,079 | 4/1963 | Harrington .......... | 148/188 |
| 3,410,710 | 11/1968 | Mochel .......... | 117/33.3 |
| 3,411,934 | 11/1968 | Englehart et al. .......... | 117/33.3 |

OTHER REFERENCES

Handbook of Chemistry and Physics, 49th Ed., published by The Chemical Rubber Co., 18901 Cranwood Pkwy., Cleveland, Ohio, page B-242 (0s92), Nov. 4, 1968.

*Primary Examiner*—L. Dewayne Rutledge
*Assistant Examiner*—J. Davis
*Attorney*—Peter J. Gaylor

ABSTRACT: Deposition of a silica film on a semiconductor surface is effected by applying, on the surface, a thin film of a solution of silicon acetate in an inert solvent, and heating the coated surface at a temperature and for a period of time adequate to decompose the acetate to a glassy silica film.

Such a silicon acetate solution may contain a soluble dopant which, upon evaporation of the solvent and heating to diffusion temperature, will enable the dopant to diffuse into any exposed semiconductor surfaces.

The silicon acetate used in this invention may be one of the compounds having the following general formula:

in which R is a substituent of the class consisting of an acetate or a vinyl group.

INVENTOR.
MILTON GENSER
BY Peter J. Gaylor
ATTORNEY

DEPOSITION OF DOPED AND UNDOPED SILICA FILMS ON SEMICONDUCTOR SURFACES

BACKGROUND OF THE INVENTION

In the processing of semiconductor devices of all types, the trend in the art has been to dope a single semiconductor crystal wafer by diffusion of selected atoms which control the conductivity type, or which act as carrier traps, into one or both surfaces of the wafer. This is generally accomplished by a process of selective masking, wherein a material, in the form of a film is prepared on the wafer surface, said film adhering tenaciously to said surface. This film is removed from selected areas of the surface by a conventional photoetching technique, or by other well-known methods. The remaining masking film prevents access of the required atom to the semiconductor (e.g. silicon) surface. In this manner, only specified areas of the wafer are affected by the dopant atom, i.e., where there are holes in the masking material.

According to present art methods, a desired masking material is pure silicon dioxide ($SiO_2$) in the form of a glassy film. Unfortunately there are important limitations to these prior art processes, as follows: (1) RF sputtering or evaporation requires elaborate equipment, and it is too limited in its application as a high volume production tool, and, (2) thermal oxidation also requires expensive furnace equipment. Also, the oxidation occurs at temperatures at which impurity redistribution can, in some cases, be deleterious to the semiconductor matrix.

Other silicon dioxide masking techniques are also employed in the art, such as those involving deposition and decomposition of silane, as well as other pyrolytic methods as, for example, gas flow processes requiring extremely precise control of flow fronts. These, again, are considerably limited as to use due to the elaborate equipment necessitated for the volume of wafers to be processed.

Silicone has also been proposed for masking purposes. However, such compounds have been found to be ineffective, possibly for the reason that the silicone molecules are so large that, after oxidation, the silica film residue retains a deleterious carbon content, thus making it unsuitable for masking purposes.

SUMMARY OF THE INVENTION

According to the present invention, a relatively simple method for preparing pure silica layers on silicon, germanium, and other Group III to V element semiconductor wafers, involves applying, to the wafer surface, a solution of silicon acetate, of concentration and thickness to produce a thin glassy film of silica upon the wafer surface after spinning and heating in air. The acetate is preferably applied in a solution of a lower aliphatic alcohol. Such a solution may also contain doping compounds, such as compounds of boron, phosphorus, arsenic, antimony, cadmium, indium gallium, aluminum, and the like.

Upon heating of the coated surface to about 250° C. for a short time, the acetate decomposes to produce a glassy, presumably silica surface which serves admirably as a masking material. By forming prespecified holes in this glassy coating, or other protective coating, to expose the semiconductor (e.g. silicon) in predetermined locations, it is possible to coat the wafer with a silicon acetate solution of the present invention, containing a dopant chemical and, after heat soaking a thus-treated wafer, the dopant atoms are caused to diffuse into the semiconductor surface at the predetermined locations. The remaining procedure merely consists in dissolving off the two protective coatings so as to bare the doped semiconductor surface so produced.

BRIEF DESCRIPTION OF THE DRAWINGS

The invention will be more readily understood by reference to the accompanying drawing in which a preferred embodiment is described, and in which.

The same numerals refer to the same or similar parts.

DESCRIPTION OF THE PREFERRED EMBODIMENTS

Figures 1, 2, 3, 4, 5, 6, 7, 8:
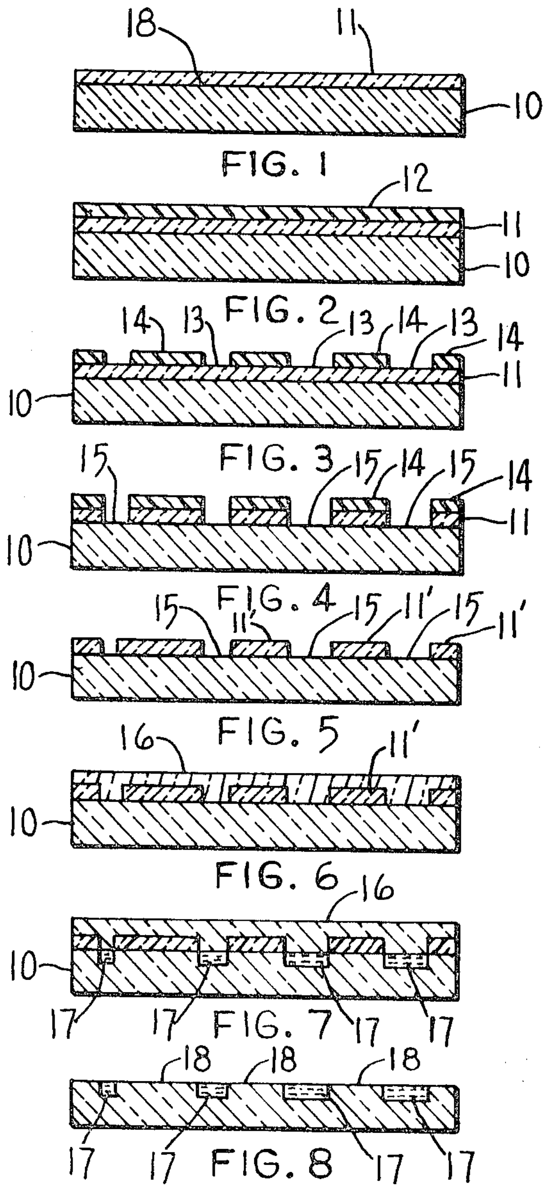
FIG. 1 depicts a cross-sectional side view of an N-type silicon wafer carrying an original silicon surface 18, and coated with a silicon acetate solution, then heated to 250° C. to form a glassy coating 11.
FIG. 2 illustrates the same wafer, after treatment as in FIG. 1, and subsequently coated with a photosensitive polymer.
FIG. 3 shows the same wafer, after treatment as in FIG. 2 and subsequently exposed through a screen, and then leached with a solvent to remove soluble (unexposed) polymer, whereby "holes" in the polymer layer are formed.
FIG. 4 presents the same wafer, after treatment as in FIG. 3, and treated further with hydrofluoric acid to remove the acetate silica layer in the hole areas.
FIG. 5 depicts the same wafer, treated as in FIG. 4, and thereafter subjected to the action of a solvent for removal of the exposed polymer layer.
FIG. 6 shows the same wafer, after treatment as in FIG. 5, and subsequently coated with a silicon acetate solution containing a boron dopant compound and heated to form a glassy film coating.
FIG 7 presents the same wafer, treated as in FIG. 6, and then heated to a high temperature to facilitate diffusion of the dopant from the silica layer and into the silicon wafer through the hole areas.
FIG. 8 shows the same wafer and treated as in FIG. 7, and then leached with hydrofluoric acid to remove the glassy silica layers, whereby a silicone wafer surface of N-type silicon is provided with specific P-type doped regions.

One application of the present invention is depicted in the accompanying drawing, in which numeral 10 designates a silicon N-type semiconductor wafer. This wafer is coated on its surface 18 with a solution of silicon acetate in an inert solvent to form a film coating. By heating the thus-coated wafer to about 240°–260° C., the acetate is believed to be decomposed, whereby a film 11 of silica remains on the wafer surface, as in FIG. 1.

Upon cooling, the thus-coated wafer is again coated with a conventional light-sensitive polymer material, such as that sold in the trade under the name "Kodak" Photoresist, as in FIG. 2. On this dry polymer coating 12 is laid a screen containing the desired hole pattern, and the screen is irradiated in conventional manner to expose the nonhole portion. Thereafter, the unexposed polymer 13 is dissolved out with conventional solvents to expose the desired "holes" 13 on the glassy silica layer 11, as in FIG. 3.

Then, the wafer is treated with 5 percent aqueous hydrofluoric acid which exerts no action upon the residual polymer portions 14, but it leaches out or dissolves the exposed glassy silica portions 13, thus leaving exposed the original wafer silicon surface 15 in the holes 13, as in FIG. 4.

After this operation, the residual protecting polymer portion 14 is dissolved off by use of a conventional solvent, such as methylene chloride, thereby leaving the glassy silica coated portions 11, covering the wafer surface except for the exposed holes 15, as in FIG. 5. The wafer, thereafter, is coated with a silicon acetate solution in an inert solvent, said solution also containing a dopant chemical, such as boric acid, and heated to about 250° C. to densify the coating into a glassy silica film 16, as in FIG. 6. This coated wafer is thereafter subjected to a heat soak at about 1100° C. for about 15 minutes, during which period the boron dopant diffuses from the glassy film 16, through the hole regions 17, and into the exposed silicon surface.

Finally, the glassy silica films 16 and 12 are subjected to a leaching action with aqueous hydrofluoric acid to expose the original N-type silicon surface 18 in which are disposed specific P-type regions 17.

Although it is not definitely known whether the process outlined herein produces silicon dioxide by decomposition of the acetate, it has been determined that, by comparing the etch rate of the glassy film produced from the acetate with the etch rate of a thermally grown silicon dioxide on silicon, there is no difference in the etch rate if the acetate-deposited film is heated at 800° C. for a few minutes. After such treatment, it is not possible to scratch the glassy film with a hard thin steel needle, and it has been found that the acetate-based film exhibits masking characteristics and other electrical properties similar to the thermally produced silica.

Another surprising discovery is the finding that if a selected impurity atom in some chemical grouping is dissolved in the silicon acetate solution, the aforesaid atom remains in diffusable form in the glassy film produced, making it a relatively easy procedure to effect selective doping of a semiconductor surface with atoms of boron, phosphorus, arsenic, antimony, zinc, cadmium, indium gallium, aluminum, and the like.

The concentration of the silicon acetate in the inert solvent may be from about 10 percent to about 30 percent by weight, and the concentration of dopant chemical dissolved with the silicon acetate may be about 0.5 percent to about 3 percent or more.

The following examples serve to illustrate the various phases of the present invention.

EXAMPLE 1

About 170 gm. of silicon tetrachloride and 102 gm. of acetic anhydride are reacted in presence of 1000 ml. of 2-ethoxyethanol solvent at a temperature of 0° C. to 5° C. for 2½ hours. The reaction taking place is believed to be as follows:

$SiC1_4+(CH_3CO)_2O \rightarrow SI(OOC_2H_5)_4+CH_3COC1$

The solvent and the acetyl chloride are distilled off, and the reaction compound, presumably silicon acetate, is crystallized from methyl alcohol, yielding white hygroscopic crystals having a m.p. of about 110°, and a boiling point of about 148° C.

EXAMPLE 2

Several P-type silicon wafers containing $3\times10^{15}$ boron atoms were coated with a 20 percent by weight solution of the "silicon acetate" from example 1, dissolved in absolute ethyl alcohol, and then spun to obtain a thin coating. Thereafter, the wafers were heated in air at about 250° C. for one-fourth hour, when the decomposition of the acetate to silicon dioxide was complete. The wafers, now coated with a dopant-impenetrable silicon dioxide glassy surface, had one-half of their exposed surface coated with Kodak KPR photoresist, leaving one-half of the surface unexposed (as in FIGS. 2–3). Thereafter, the wafers were dipped in a dilute 5 percent aqueous hydrofluoric acid solution until the exposed silicon dioxide layer (13 in FIG. 3) was removed, leaving exposed the original silicon P-type surface.

After removal of the protecting 96 layer (14 in FIG. 4) on the other half of the wafers, the wafers were coated with an ethanol solution of 20 percent silicon acetate containing, in each separate case, 2 percent each of dissolved arsenic pentoxide, antimony, trichloride, and phosphorus pentoxide. The wafers then were individually subjected to a heat soak at 1100° C. for 15 minutes. At the end of this time, the wafers were removed, cooled, and the silicon dioxide surfaces (e.g., surfaces 16 in FIGS. 6–7) were removed by etching with HF solution.

By thermoelectric probing, it was found that the surfaces protected by the silicon dioxide were still of the P-type, whereas the unprotected surfaces of the wafers were of the N-type. The sheet resistivities of the N-type portions were as follows:

Phosphorus - 10 ohms/square
Arsenic - 40 ohms/square
Antimony - 200 ohms/square

EXAMPLE 3

A similar test was carried out with an N-type wafer containing $5\times10^{15}$ phosphorus atoms. The dioxide glassy film again was formed from silicon acetate, as in example 2, but in this case the dopant (dissolved in the ethanol solution of silicon acetate) was 1 percent boric acid. No change was observed in the silica-protected portions of the wafers, but the unprotected portions exhibited a sheet resistivity of 20 ohms/square, and they were of the P-type. In the unprotected portions, the sheet resistivity was noticeably uniform over the wafer surface, and the highly polished surfaces were undisturbed. The tests show the masking capabilites of the acetate-based dioxide glassy film, as well as the doping capabilities of the glassy dioxide when its solution contains dopant atoms.

EXAMPLE 4

A similar test, as in example 2, was carried out with 5 percent gold chloride in the silicon acetate solution. A marked increase in resistivity was evidenced due to compensation by the gold.

EXAMPLE 5

A similar test, as in example 2, was carried out with gallium arsenide wafers, and a silicon acetate solution containing 10 percent zinc dopant yielded a P-type surface.

The desired solvents for the silicon acetate are anhydrous lower aliphatic alcohols having no more than four carbon atoms. These alcohols may contain ether groups. Examples of such solvents are methanol, ethanol, propanol, isobutanol, and 2-ethoxyethanol.

The silicon acetate is heated to a decomposition temperature of about 225° C. to about 275° C. for a period of about 10 minutes to about one-half hour. In the case of the acetate containing the dopant chemical, the wafer is heated (soaked) at a temperature and for a period of time to permit diffusion of the dopant atoms into the silicon substrate surface. Such a temperature may be about 1000° C. to about 1200° C., and the time period about 10 minutes to about one-half hour.

It is to be understood that the silicon dioxide film of the present invention may be applied onto any semiconductor surface which may or may not have previously been coated with a protective coating, such as silicon nitride, or other masking surface. In the event a screen has been employed to produce "holes" in the immediately adjacent protective coating, the overlaying silicon dioxide coating of the present invention may contain a dissolved dopant which, upon suitable heat-soaking, will diffuse into the semiconductor surface.

Alumina also is often employed as a coating substrate for hybrid microcircuits, and a glaze layer of glass is applied thereover. According to the present invention, the silicon dioxide from the silicon acetate solution may be employed in lieu of the glass layer to give a more uniform and purer coating.

The silicon acetate of the present invention may also contain a vinyl group. For example, a vinyl triacetoxy silane may be produced by reacting acetic anhydride with vinyl trichlorosilane, which latter compound may be used as the silicon tetra-acetate heretofore described. Accordingly, the silicon acetate compound, which may be used for the present invention, may have the formula:

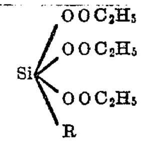

wherein R is a substituent of the class consisting of an acetate or a vinyl group.

An additional variation in the use of the present invention involves the coating of the semiconductor surface directly with a thin film of silicon acetate containing a dopant chemical, after which the wafer is heated only high enough to decompose the silicon acetate layer to a glassy dioxide film. Thereafter, a screen may be applied to the glassy surface, and the portions which are not to be doped are dissolved away with HF, or other suitable reagent. Then, the wafer is coated over its entire surface with silicon acetate, free of dopants, and heated for conversion to the dioxide, whereupon, finally, the wafer is heat-soaked at diffusion temperature for diffusion into the desired surface portions of the semiconductor.

I claim:

1. The method of depositing a silica film on a semiconductor surface, comprising:

applying, on said surface, in the form of a thin film, an inert solvent solution of a silicon acetate compound having the general formula:

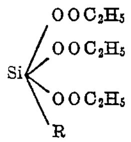

wherein R wherein R is a substituent of the class consisting of an acetate or a vinyl group, and heating said coated surface to a temperature and for a period of time adequate to decompose said compound to a glassy silica film.

2. The process according to claim 1 in which said compound solution contains a soluble dopant compound, and heating said coated surface to a temperature and for a time sufficient to permit said dopant to diffuse into said semiconductor surface.

3. The process, according to claim 1, in which the silicon acetate compound is silicon tetra-acetate.

4. The process, according to claim 1, in which the silicon acetate compound is vinyl triacetoxy silane.

5. The method, according to claim 1, wherein the inert solvent is an anhydrous aliphatic alcohol having no more than four carbon atoms.

6. The method, according to claim 1, in which the coated surface is heated at about 225° C. to about 275° C. for about 10 minutes to about one-half hour.

7. The method, according to claim 1, wherein said coated surface is provided with holes penetrating said coating, applying on said coating and penetrated surface a thin film of a solution of silicon acetate in an inert solvent and containing a dissolved dopant chemical, heating said recoated surface to a temperature and for a period of time sufficient to permit diffusion of the dopant atoms into the semiconductor surface through said holes, and removing both coatings so as to leave a bare semiconductor surface having doped regions.

8. The method, according to claim 7, in which the recoated surface is heated at about 1000 ° C. to about 1200° C. for about 10 minutes to one-half hour.

9. The method, according to claim 1, in which said compound contains a soluble dopant compound, applying a screen to the glassy layer to screen out portions of the semiconductor surface to be doped, dissolving away the glassy surface containing dopant from the unscreened portions of the surface, coating the thus-treated surface with a thin layer of dopant-free silicon acetate compound, and heating the latter surface to a temperature and for a time sufficient to permit said dopant to diffuse into said semiconductor surface.

* * * * *

UNITED STATES PATENT OFFICE
CERTIFICATE OF CORRECTION

Patent No. 3,615,943 Dated Oct. 26, 1971

Inventor(s) Milton Genser

It is certified that error appears in the above-identified patent and that said Letters Patent are hereby corrected as shown below:

In the Abstract and in Claim 1, as well as in column 4, lines 60 to 65 of the patent, the formula therein should appear as follows:

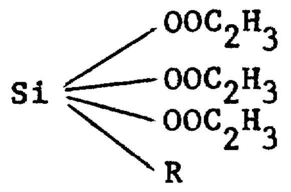

In the equation given in column 3, line 31 of the patent, the first formula after the arrow should appear as follows:

$$Si(OOC_2H_3)_4$$

Signed and sealed this 18th day of April 1972.

(SEAL)
Attest:

EDWARD M.FLETCHER,JR.
Attesting Officer

ROBERT GOTTSCHALK
Commissioner of Patents

RM PO-1050 (10-69)

USCOMM-DC 60376-P69
☆ U.S. GOVERNMENT PRINTING OFFICE : 1969 O—366-334